(12) United States Patent
Chen et al.

(10) Patent No.: US 7,858,438 B2
(45) Date of Patent: Dec. 28, 2010

(54) SEMICONDUCTOR DEVICE, CHIP PACKAGE AND METHOD OF FABRICATING THE SAME

(75) Inventors: Chien-Ru Chen, Tainan County (TW); Ying-Lieh Chen, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 30 days.

(21) Appl. No.: 11/762,507

(22) Filed: Jun. 13, 2007

(65) Prior Publication Data

US 2008/0308929 A1 Dec. 18, 2008

(51) Int. Cl.
*H01L 21/00* (2006.01)

(52) U.S. Cl. .................. 438/108; 438/106; 438/107; 438/109; 438/110; 438/111; 438/112; 438/113; 438/114; 438/115; 438/116; 438/117; 438/118; 438/119; 438/120; 438/121; 438/122; 438/123; 438/124; 438/125; 438/126; 257/733; 257/734; 257/735; 257/736; 257/737

(58) Field of Classification Search .................. 257/733, 257/734, 735, 736, 737, 738
See application file for complete search history.

(56) References Cited

U.S. PATENT DOCUMENTS

| | | | | |
|---|---|---|---|---|
| 3,530,231 A * | 9/1970 | Penoyer | ...................... | 174/261 |
| 5,854,513 A * | 12/1998 | Kim | ........................... | 257/737 |
| 5,892,179 A * | 4/1999 | Rinne et al. | .................. | 174/261 |
| 5,977,632 A * | 11/1999 | Beddingfield | ............... | 257/737 |
| 6,197,613 B1 * | 3/2001 | Kung et al. | .................. | 438/106 |
| 6,329,608 B1 * | 12/2001 | Rinne et al. | .................. | 174/261 |
| 6,358,836 B1 * | 3/2002 | Lu et al. | ...................... | 438/618 |
| 6,362,087 B1 * | 3/2002 | Wang et al. | .................. | 438/597 |
| 6,372,622 B1 * | 4/2002 | Tan et al. | .................... | 438/612 |
| 6,445,001 B2 * | 9/2002 | Yoshida | ........................ | 257/48 |
| 6,525,422 B1 * | 2/2003 | Ono et al. | .................... | 257/737 |
| 6,617,236 B2 * | 9/2003 | Oosawa et al. | ............. | 438/613 |
| 6,617,655 B1 * | 9/2003 | Estacio et al. | ............... | 257/401 |
| 6,664,630 B2 * | 12/2003 | Kanai et al. | .................. | 257/728 |
| 6,713,870 B2 * | 3/2004 | Fang | ........................... | 257/734 |
| 6,734,554 B2 * | 5/2004 | Sugiura | ....................... | 257/724 |
| 6,800,944 B2 * | 10/2004 | Buschbom | ................... | 257/778 |
| 6,815,327 B2 * | 11/2004 | Farnworth | .................... | 438/614 |
| 6,861,749 B2 * | 3/2005 | Wu et al. | ...................... | 257/737 |
| 6,943,103 B2 * | 9/2005 | Kuo et al. | .................... | 438/613 |
| 7,067,412 B2 * | 6/2006 | Fukumoto | .................... | 438/599 |
| 7,122,458 B2 * | 10/2006 | Cheng et al. | ................. | 438/612 |
| 7,213,740 B2 * | 5/2007 | Rinne | ..................... | 228/180.22 |
| 7,223,683 B2 * | 5/2007 | Lin | ................................ | 438/613 |
| 7,239,028 B2 * | 7/2007 | Anzai | .......................... | 257/786 |
| 7,344,968 B2 * | 3/2008 | Sasaki | .......................... | 438/611 |
| 7,498,251 B2 * | 3/2009 | Lu | ................................ | 438/613 |
| 2002/0063332 A1 * | 5/2002 | Yamaguchi et al. | ......... | 257/738 |
| 2002/0185721 A1 * | 12/2002 | Hwang et al. | ............... | 257/678 |

(Continued)

*Primary Examiner*—Fernando L Toledo
*Assistant Examiner*—Ankush k Singal

(57) ABSTRACT

A semiconductor device has a chip, a first bump electrode, a conductive wire and a second bump electrode. The chip has at least one contact pad, and the first bump electrode is formed on the contact pad. The conductive wire is disposed on an active surface of the chip and electrically connected to the first bump electrode. The second bump electrode is formed on the conductive wire, and the second bump electrode is not disposed over any contact pad of the chip. In addition, a method for packaging a chip and an IC package are also disclosed.

4 Claims, 5 Drawing Sheets

U.S. PATENT DOCUMENTS

| | | | |
|---|---|---|---|
| 2002/0197766 A1* | 12/2002 | Akram et al. | 438/106 |
| 2003/0071284 A1* | 4/2003 | Kanai et al. | 257/200 |
| 2003/0129821 A1* | 7/2003 | Weng | 438/612 |
| 2003/0141591 A1* | 7/2003 | Hsu et al. | 257/737 |
| 2003/0168734 A1* | 9/2003 | Fang | 257/734 |
| 2004/0040855 A1* | 3/2004 | Batinovich | 205/123 |
| 2004/0056351 A1* | 3/2004 | Wu et al. | 257/737 |
| 2004/0185649 A1* | 9/2004 | Huang et al. | 438/612 |
| 2004/0266066 A1* | 12/2004 | Wang | 438/123 |
| 2005/0009317 A1* | 1/2005 | Lin | 438/613 |
| 2005/0017343 A1* | 1/2005 | Kwon et al. | 257/698 |
| 2005/0026413 A1* | 2/2005 | Lee et al. | 438/612 |
| 2005/0164486 A1* | 7/2005 | Lua et al. | 438/617 |
| 2005/0189650 A1* | 9/2005 | Lee et al. | 257/738 |
| 2005/0224972 A1* | 10/2005 | Domon et al. | 257/737 |
| 2006/0019480 A1* | 1/2006 | Cheng et al. | 438/612 |
| 2006/0057772 A1* | 3/2006 | Huang | 438/106 |
| 2006/0073693 A1* | 4/2006 | Huang | 438/613 |
| 2006/0094224 A1* | 5/2006 | Huang et al. | 438/612 |
| 2006/0094226 A1* | 5/2006 | Huang et al. | 438/613 |
| 2006/0163729 A1* | 7/2006 | Lin et al. | 257/738 |
| 2007/0145602 A1* | 6/2007 | Yang | 257/777 |
| 2008/0048317 A1* | 2/2008 | Krueger et al. | 257/737 |
| 2008/0083962 A1* | 4/2008 | Vaganov | 257/417 |
| 2008/0113503 A1* | 5/2008 | Lee et al. | 438/614 |
| 2008/0169558 A1* | 7/2008 | Lu | 257/737 |
| 2008/0224326 A1* | 9/2008 | Kuo et al. | 257/780 |

* cited by examiner

SEMICONDUCTOR DEVICE, CHIP PACKAGE AND METHOD OF FABRICATING THE SAME

BACKGROUND

1. Field of Invention

The present invention relates to a semiconductor device. More particularly, the present invention relates to a chip package and the process of fabricating the same.

2. Description of Related Art

FIG. 1 is a conventional semiconductor device. A chip 102 generally has several contact pads on its surface, and UBM (under bump Metallurgy) and bump electrodes 104 are orderly formed onto the contact pads for interconnection. The semiconductor device allows for a large number of interconnections with shorter distances than wire, which greatly reduces inductance. However, the contact pad positions of the chip 102 is fixed such that another interface for connecting the chip 102 has to provide wires or contact pads corresponding to these bumps 104 in fixed positions. The conventional semiconductor device thus reduces the flexibility of interconnection between the chip 102 and other interfaces.

SUMMARY

According to one embodiment of the present invention, a semiconductor device comprises a chip, a first bump electrode, a conductive wire and a second bump electrode. The chip has at least one contact pad, and the first bump electrode is formed on the contact pad. The conductive wire is disposed on an active surface of the chip and electrically connected to the first bump electrode. The second bump electrode is formed on the conductive wire, and the second bump electrode is not disposed over any contact pad of the chip.

According to another embodiment of the present invention, a method for packaging a chip is disclosed. A chip having contact pads is provided, and a conductive wire is formed on an active surface of the chip. A first bump electrode is formed on one of the contact pads, and the conductive wire is electrically connected to the first bump electrode. A second bump electrode is formed on the conductive wire, and the second bump electrode is not disposed over any of the contact pads of the chip.

According to another embodiment of the present invention, an IC package comprises a circuit board and a chip. The circuit board has at least one first terminal and at least one second terminal, and the chip is mounted on the circuit board. The chip comprises a first bump electrode, a conductive wire and a second bump electrode. The first bump electrode is formed on a contact pad of the chip. The conductive wire is disposed on an active surface of the chip and electrically connected to the first bump electrode. The second bump electrode is formed on the conductive wire, and the second bump electrode is not disposed over any contact pad of the chip. After mounting the chip on the circuit board, the first terminal is directly connected to the first bump electrode, and the second terminal is directly connected to the second bump electrode.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
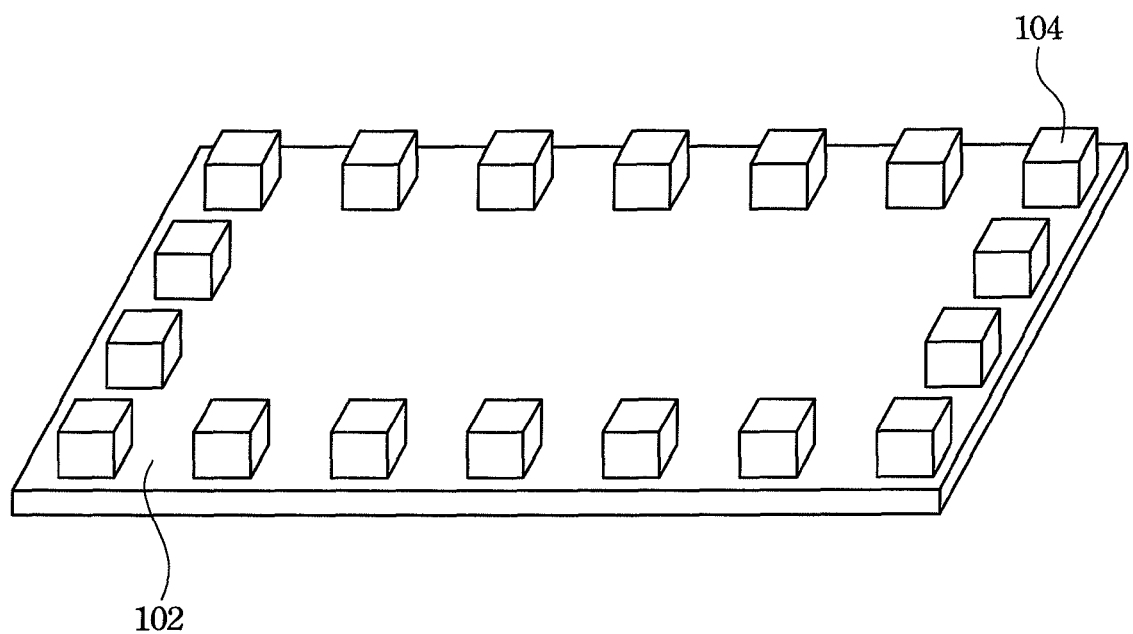
FIG. 1 is a conventional semiconductor device.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
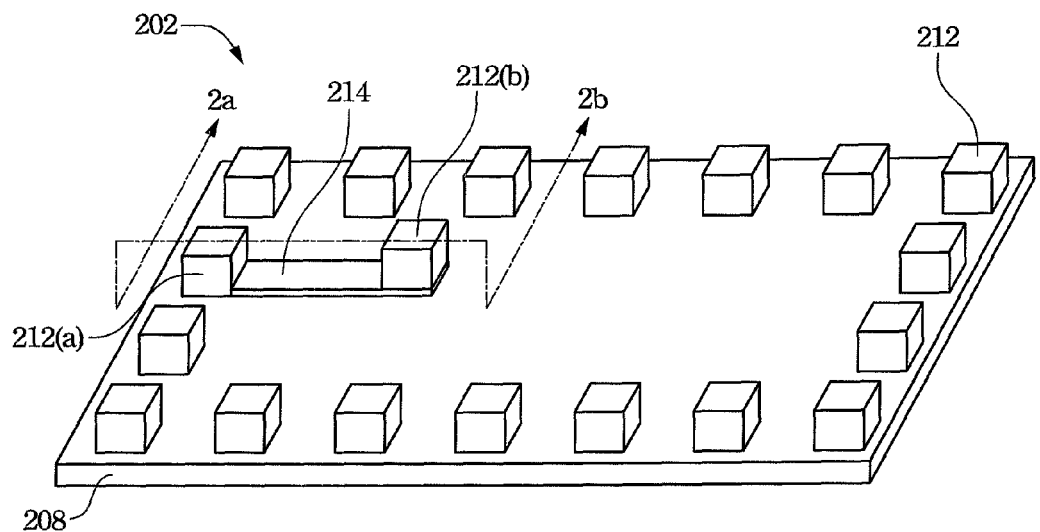
FIG. 2A is a semiconductor device according to one embodiment of the present invention.

FIG. 2A is a semiconductor device according to one embodiment of the present invention. The semiconductor device 202 includes a chip 208 which has contact pads on the active surface thereof and bump electrodes 212 formed on the contact pads. The semiconductor device 202 also includes a conductive wire 214 electrically connected to one of the bump electrodes 212, e.g. the first bump electrode 212(a). The semiconductor device 202 further includes a second bump electrode 212(b) formed on the conductive wire 214. The conductive wire 214 is formed on the active surface of the chip 208. The second bump electrode 212(b) is not disposed over any contact pads of the chip 208.

Figure 2B:
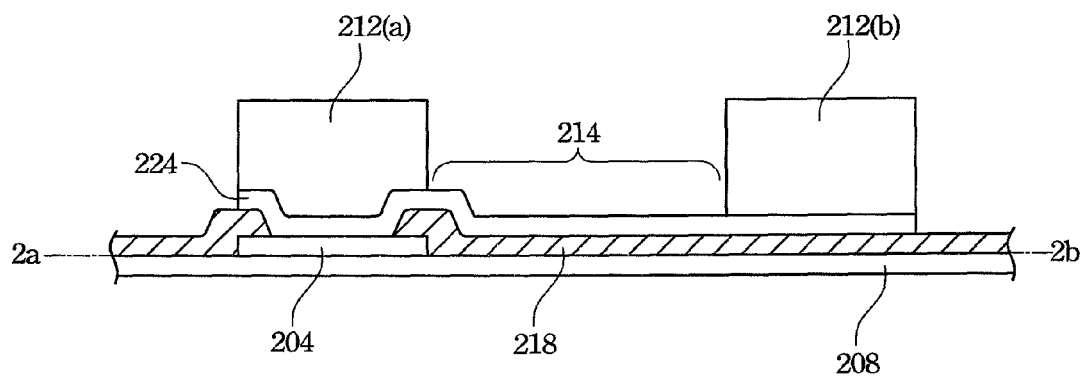
FIG. 2B is a cross-sectional view taken along line 2a-2b of FIG. 2A.

FIG. 2B is a cross-sectional view taken along line 2a-2b of FIG. 2A. The semiconductor device 202 has the chip 208 protected by a dielectric layer such as a passivation layer 218, which has openings to expose the contact pads 204. The passivation layer 218 may be a polyimide layer, a silicon dioxide layer, a silicon nitride layer or layers of other passivation materials known to those skilled in the art. Each of the contact pads 204 is covered by under bump metallurgy, e.g. UBM 224, and the first bump electrode 212(a) is formed on the UBM 224. The electrical connection between the contact pad 204 and the first bump electrode 212(a) is made by the UBM 224.

In the embodiment, the conductive wire 214 is made of the same material as the under bump metallurgy and electrically connects to the first bump electrode 212(a) via the UBM 224 thereof. The second bump electrode 212(b) is formed on the conductive wire 214 and electrically connected to the first bump electrode 212(a) via the conductive wire 214.

Figure 3:
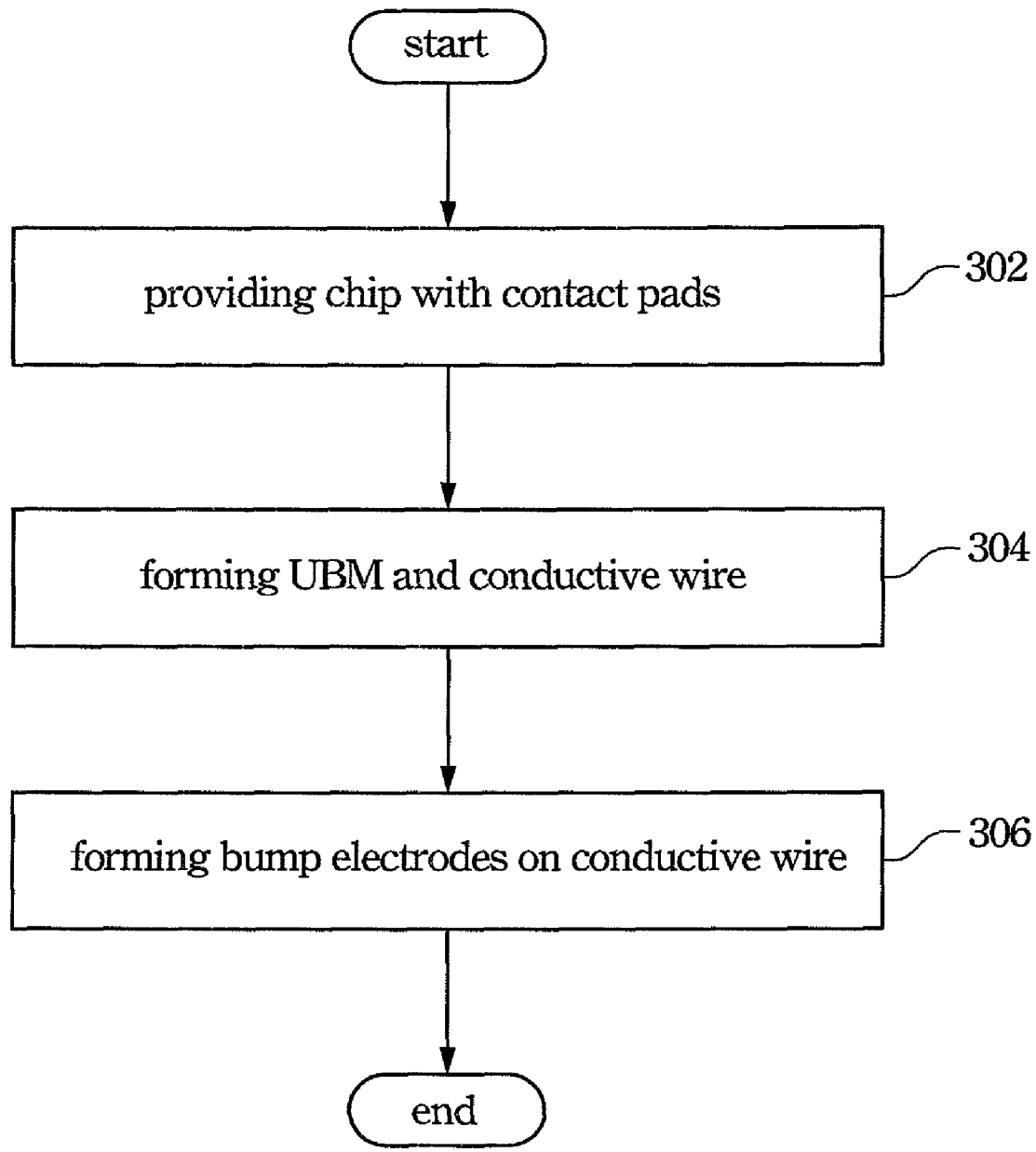
FIG. 3 is a flow chart of a method of fabricating the semiconductor device according to another embodiment of the present invention.

FIG. 3 is a flow chart of a method of fabricating the semiconductor device. The following descriptions are made with reference to FIG. 2B. Firstly, the chip 208 with the contact pads is provided (step 302). Next, UBM 224 and the conductive wire 214 are formed (step 304). The UBM 224 is formed on the contact pad 204, and the conductive wire 214 made of the same material as under bump metallurgy is formed on the active surface of the chip 208. Then, the bump electrode electrodes including the first bump electrode 212(a) and the second bump electrode 212(b) are formed (step 306). The first bump electrode 212(a) is formed on the UBM 224 which covers the contact pad 204, and the conductive wire 214 is thus electrically connected to the first bump electrode 212(a). The second bump electrode 212(b) is formed on the conductive wire 214, and the second bump electrode 212(b) is not disposed over the contact pads 204 of the semiconductor device 202.

Figure 4A:
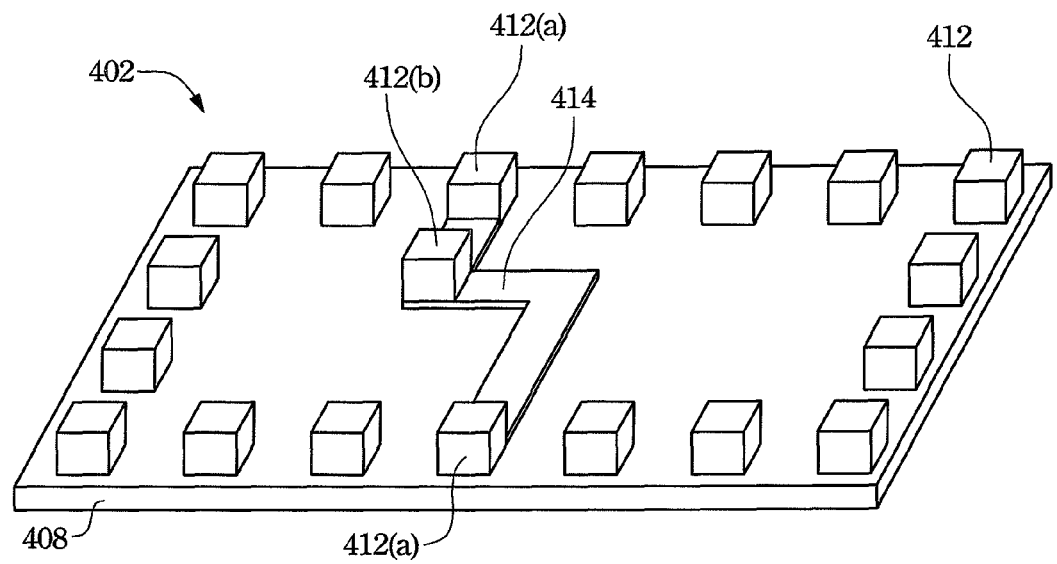
FIG. 4A is a semiconductor device according to another embodiment of the present invention.

Moreover, there are plural forms of the conductive wire 214. FIG. 4A is a semiconductor device according to another embodiment of the invention. The semiconductor device 402 includes a chip 408, bump electrodes 412 having the first bump electrodes 412(a), and includes the conductive wire 414 and the second bump electrode 412(b). The conductive wire 414 has at least one turn and connecting two first bump electrodes 412(a) and the second bump electrode 412(b). The second bump electrode 412(b) is not disposed over any contact pads of the chip 408. Connecting the conductive wire 414 with the two first bump electrodes 412(a) and the second bump electrode 412(b) increases the extensibility of the interconnection and/or ensures the reliability of the signal transmission between the two first bump electrodes 412(a) if they have been connected to each other inside the chip 408.

Figure 4B:
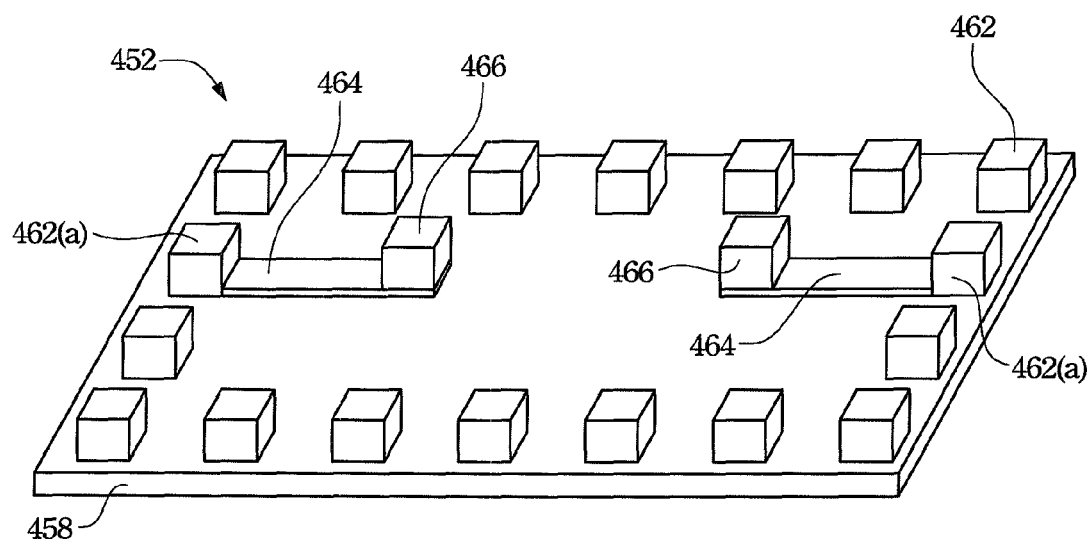
FIG. 4B is a semiconductor device according to another embodiment of the present invention.

FIG. 4B is a semiconductor device according to another embodiment of the invention. The semiconductor device 452 includes a chip 458, bump electrodes 462 having first bump electrodes 462(a), and includes a conductive wires 464 and second bump electrodes 466. The first bump electrodes 462(a) are disposed on contact pads while the second bump electrodes 466 are not disposed on any contact pads of the chip 458. There are two second bump electrodes 466, each at one end of the corresponding conductive wire 464. Persons skilled in the art can design any form of conductive wire to configure the second bump electrode in a proper position for correspondingly connecting other device or wire.

The semiconductor device 202, 402 or 452 can be a wafer-die and can be packaged on a carrier. For example, the carrier is a PCB (printed circuit board) substrate in the flip chip package, a film in the tape carrier package (TCP) or a panel in the chip-on-glass (COG) package. The contact terminals on the carrier can connect to the corresponding pad under the first bump electrode directly via the first bump electrode or indirectly via the second bump electrode, such that the routing of the carrier is more flexible.

Figure 5:
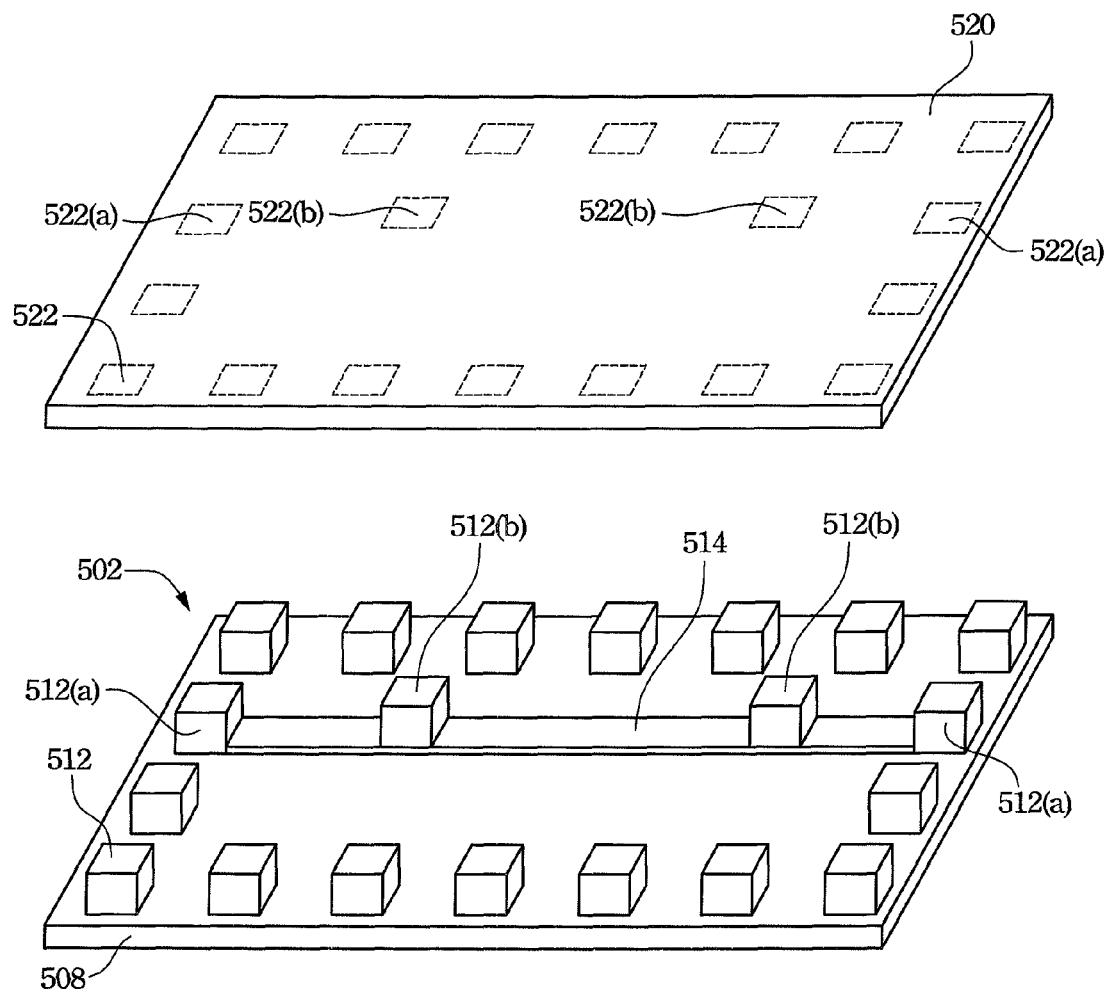
FIG. 5 is a diagram of an IC package according to another embodiment of the present invention.

FIG. 5 is a diagram of an IC package according to another embodiment of the present invention. The IC package has a semiconductor device 502 and a carrier such as circuit board 520. The semiconductor device 502 includes a chip 508, bump electrodes 512 and a conductive wire 514. The bump electrodes 512 includes the first bump electrodes 512(a) and the second bump electrodes 512(b). The second bump electrodes 512(b) are not disposed over any contact pads. The conductive wire 514 connects the two first bump electrodes 512(a) and has two second bump electrodes 512(b) formed thereon.

The circuit board 520 has plural terminals 522 to be connected to the bump electrodes 512 of the semiconductor device 502. The terminals 522 includes the first terminals 522(a) and second terminals 522(b), and the semiconductor device 502 is mounted on the circuit board 520 to form the IC package. The circuit board 520 further includes plural outer leads (not shown) to connect the terminals 522 with outer electronic elements.

The first terminals 522(a) of the circuit board 520 are directly connected to the first bump electrodes 512(a) respectively. The second bump electrodes 512(b) are directly connected to the second terminals 522(b) respectively. The terminals 522(a) and 522(b) are electrically connected via the first bump electrodes 512(a), the second bump electrodes 512(b) and the conductive wire 514 of the semiconductor device 502 so as to increase the routing flexibility of the circuit board 520.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An IC package, comprising:
 a circuit board having at least one first terminal and at least one second terminal; and
 a chip mounted on the circuit board, the chip comprising:
  a contact pad formed on the chip;
  a under bump metallurgy formed on the contact pad;
  a first bump electrode formed on the under bump metallurgy, wherein the first bump electrode is electrically connected to the contact pad through the under bump metallurgy;
  a conductive wire disposed on an active surface of the chip and electrically connected to the under bump metallurgy on which the first bump electrode is formed; and
  a second bump electrode formed on the conductive wire, wherein the second bump electrode is not disposed over any contact pad of the chip;
 wherein after mounting the chip on the circuit board, the first terminal is directly connected to the first bump electrode; and the second terminal is directly connected to the second bump electrode, and the first terminal and the second terminal are electrically connected via the first bump electrode, the second bump electrode and the conductive wire.

2. The IC package as claimed in claim 1, wherein the conductive wire is made of under bump metallurgy (UBM).

3. The IC package as claimed in claim 1, wherein the conductive wire is connected to at least one of first bump electrodes of the chip, such that the second terminal is electrically connected to one of the first bump electrodes via the second bump electrode and the conductive wire.

4. The IC package as claimed in claim 3, wherein an electrical connection between the corresponding contact pad and the first bump electrode that connects to the conductive wire is made by UBM.

* * * * *